(12) United States Patent
Hennessy et al.

(10) Patent No.: US 7,369,377 B1
(45) Date of Patent: May 6, 2008

(54) SNUBBERS FOR LOW TEMPERATURE POWER ELECTRONICS

(76) Inventors: Michael J. Hennessy, 9 Patroon Pl., Ballston Lake, NY (US) 12019; John N. Park, 723 Grooms Rd., Rexford, NY (US) 12148; Otward M. Mueller, 96 Sweet Rd., Ballston Lake, NY (US) 12019; Eduard K. Mueller, 20 McCormicks La., Ballston Lake, NY (US) 12019

( * ) Notice: Subject to any disclaimer, the term of this patent is extended or adjusted under 35 U.S.C. 154(b) by 0 days.

(21) Appl. No.: 11/224,184

(22) Filed: Sep. 12, 2005

Related U.S. Application Data

(60) Provisional application No. 60/609,169, filed on Sep. 11, 2004.

(51) Int. Cl.
*H02H 7/00* (2006.01)
*H02H 9/00* (2006.01)
*H01L 29/00* (2006.01)
*H01L 23/34* (2006.01)

(52) U.S. Cl. .................. 361/19; 257/532; 257/536; 257/713; 257/714; 257/716

(58) Field of Classification Search .............. 361/19
See application file for complete search history.

(56) References Cited

U.S. PATENT DOCUMENTS 5,965,959 A * 10/1999 Gamble et al. ............ 307/125
6,163,064 A * 12/2000 Evans, III .................. 257/532

* cited by examiner

*Primary Examiner*—Michael Sherry
*Assistant Examiner*—Dharti H Patel
(74) *Attorney, Agent, or Firm*—Leonard Cooper

(57) ABSTRACT

Switching losses and conduction losses are isolated by networks which are partially cryogenic and partially at room temperature. Switching losses are independent of temperature. Advantageously the switching losses are taken in a snubber network at room temperature and conduction losses are incurred at cryogenic temperatures, where majority carrier devices like MOSFETs operate with ultra low on-state resistance and corresponding low conduction losses. Low loss leads carry current efficiently from the cryogenic environment to room temperature without adversely affecting refrigeration. Switch and snubber network may both operate cryogenically.

11 Claims, 6 Drawing Sheets

Equivalent Circuit of a Snubber

SNUBBERS FOR LOW TEMPERATURE POWER ELECTRONICS

This patent application claims the benefit of provisional patent application 60/609,169, filed Sep. 11, 2004.

BACKGROUND OF THE INVENTION

Snubber circuits are routinely used to reduce the dV/dt across switching networks and to reduce ringing. This is usually done with series RC networks placed in parallel with the switch as shown in FIG. 1. There an electronic switch 10 is in series with a source impedance 12 and a load impedance 14 across a voltage input $V_o$ to ground. A snubber network, including a resistance R 16 in series with a capacitor C 18, is in parallel with the switch 10. This circuitry costs energy due to the joule heating of the snubber network. At cryogenic temperatures this can lead to large losses amplified by the refrigeration factor. For example for LN2 systems (liquid nitrogen) the refrigeration factor can approach 12 watts refrigeration per watt of dissipation at 77K.

High performance cryogenic solid-state switches such as MOSFETs operated at low temperatures exhibit extremely high switching speeds, and are therefore prone to ringing. One can reduce the ringing by slowing down the gate voltage drive at the cost of higher energy dissipation. One can also add snubber networks, which produce additional dissipation. In many devices, such as thyristors, one has no alternative but to add snubbers. In some cases, the switches (particularly thyristor-based devices) are very sensitive to false triggering due to high dV/dt and require snubbers to operate.

SUMMARY OF THE INVENTION

Concepts have recently been developed whereby switching losses and conduction losses are isolated by networks which are partially cryogenic and partially at room temperature. The switching losses are independent of temperature, so it is advantageous to take the switching losses at room temperature and to incur the conduction losses at cryogenic temperatures, where majority carrier devices like MOSFETs operate with ultra low on-state resistance and corresponding low conduction losses. This separation becomes practical because the average current during switching can be quite low, enabling low loss leads to carry current efficiently from the cryogenic environment to room temperature without adversely affecting refrigeration.

DESCRIPTION OF PREFERRED EMBODIMENTS

Figure 1:
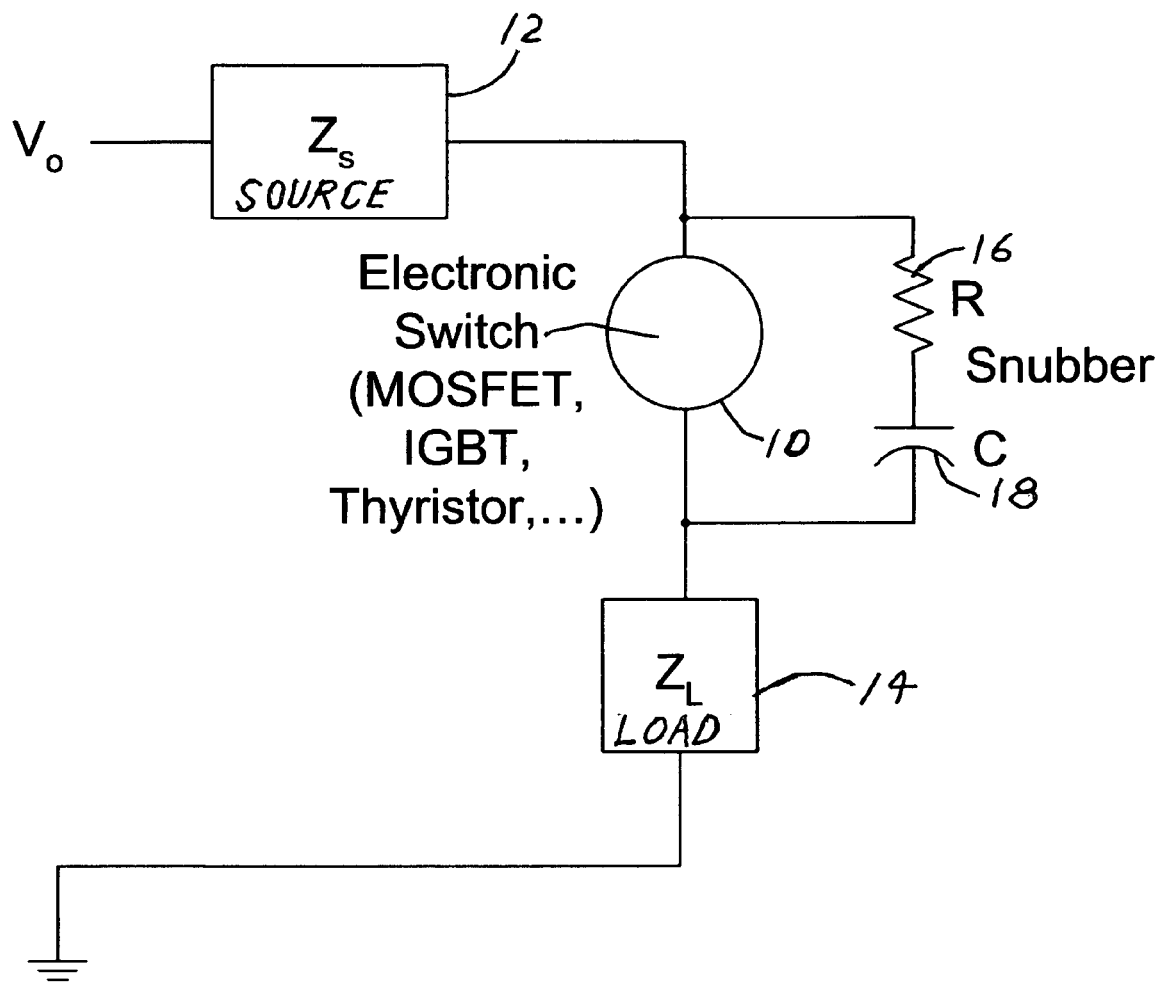
FIG. 1 is a schematic of a conventional switch and snubber network.
Figure 2:
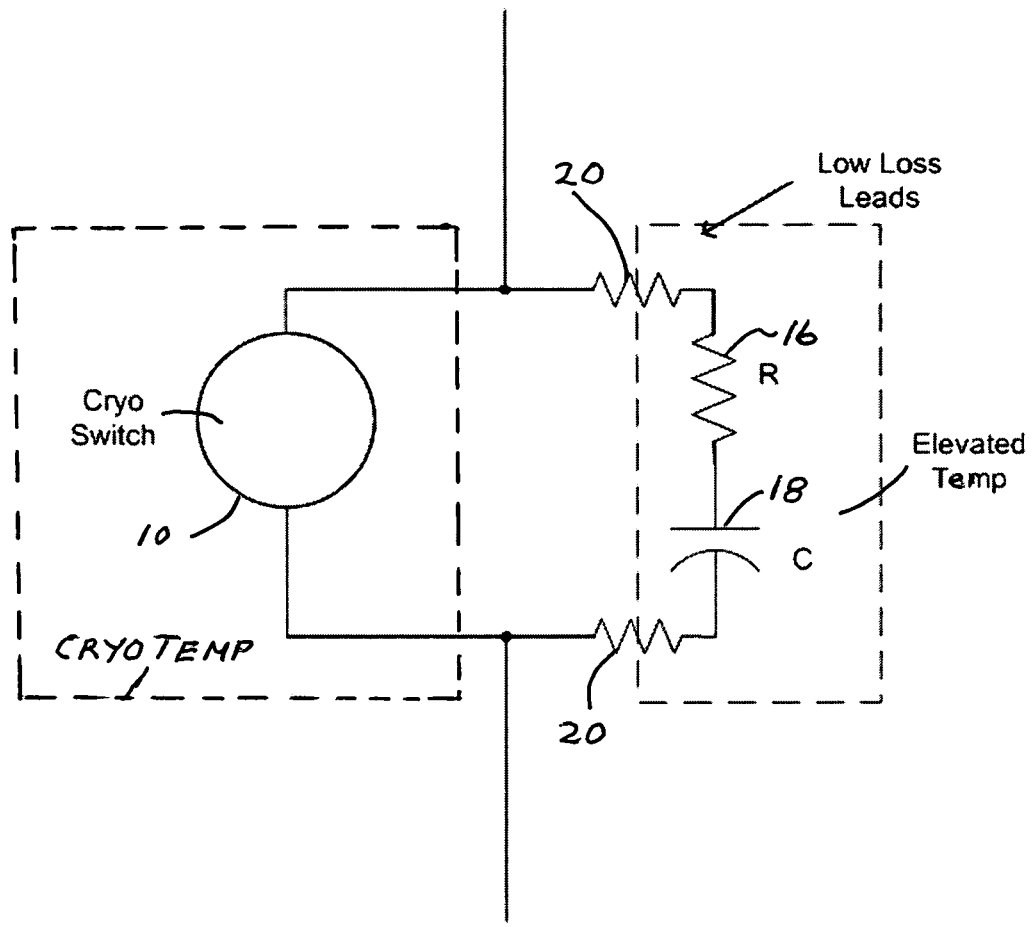
FIG. 2 is a schematic of a switch and snubber network in accordance with the invention.

In one construction to reduce dissipation in cryogenically operated power devices, snubbers are added at room temperature with low inductance interconnecting leads, as shown in FIG. 2. There the switch 10 operates with high speed at cryogenic temperature and the snubber network 16, 18 operates at a higher temperature e.g. room temperature. The leads 20, having cold ends and warmer ends, connect the switch and snubber network. This network absorbs most of the load current as the switch opens. For typical snubber network designs the RC time constant is longer than the switching time.

Figure 3:
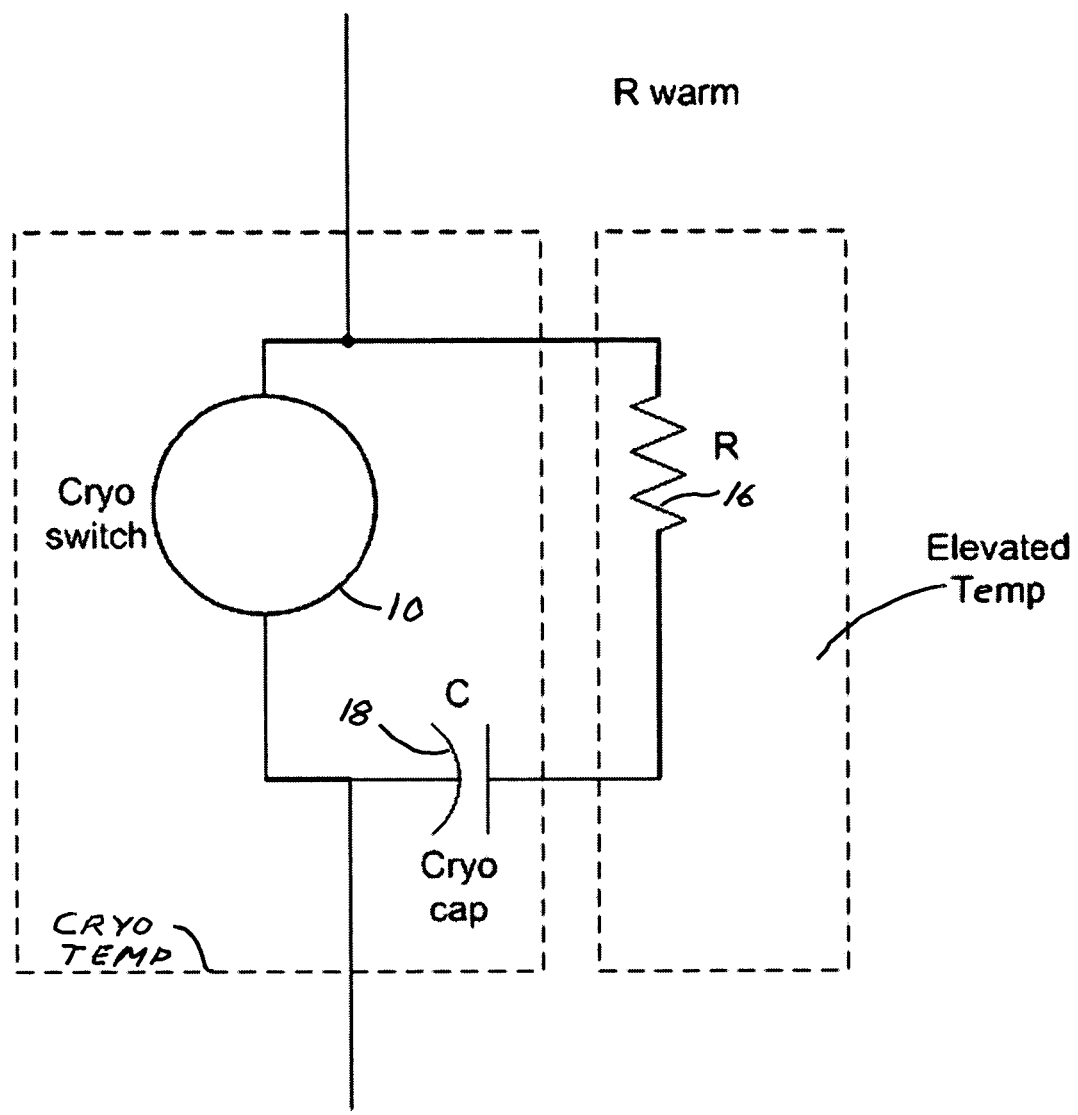
FIGS. 3, 5, 6 are respectively alternative embodiments of a switch and snubber network in accordance with the invention.

In some cases it is advantageous to cool the switch 10 and C 18 of the snubber network and to move the R 16 to room temperature as shown in FIG. 3. The choice depends on the available capacitor technology. In some cases, the voltage capability of capacitors increases at cryogenic temperatures, leading to higher energy density and therefore a reduction in size and weight.

Figure 4:
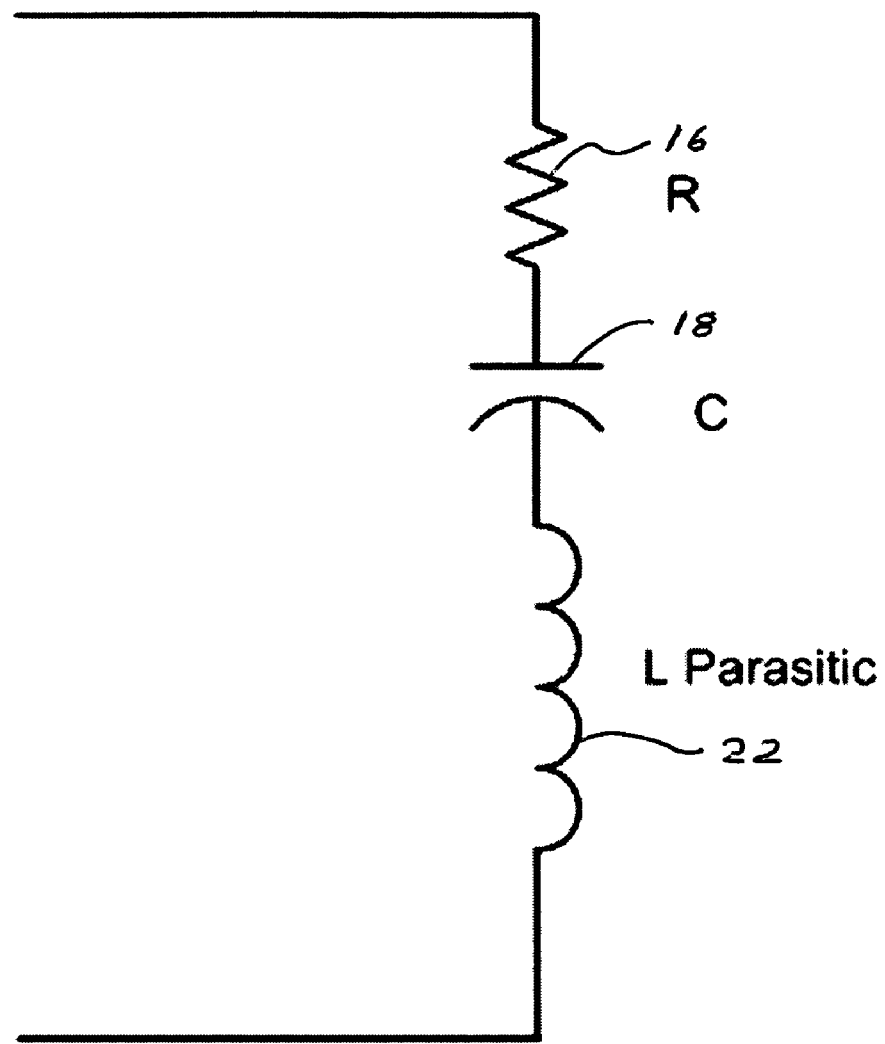
FIG. 4 is an equivalent circuit of an RC snubber network.
Figure 5:
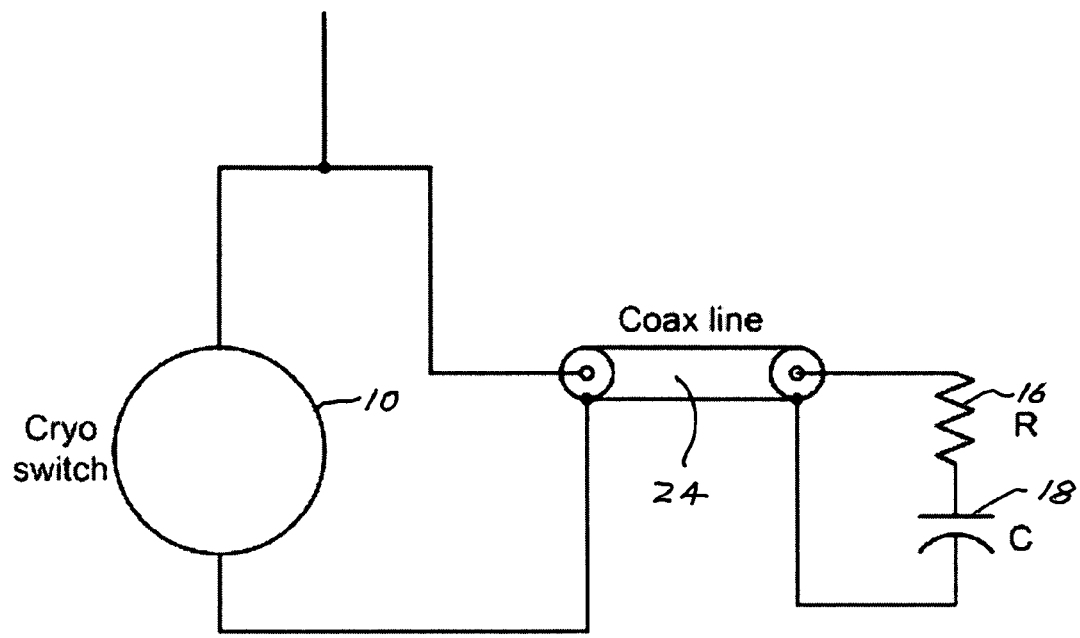

An equivalent circuit of a snubber network in FIG. 4 shows the parasitic inductance 22 inherent in the RC branch. In practice one tries to reduce the parasitic inductance as much as possible by careful layout, etc. Geometries using coaxial low loss leads 24 are attractive for this application. This is shown in FIG. 5. The RC network (FIG. 5) can be warm or cold.

The advantages of the present inventions are as follows:
1) Passive components absorb switching losses.
2) This leads to increased reliability and simplicity.
3) The use of cryogenic capacitors as part of the snubber network can reduce the size and weight of the snubber network which can be quite large in large power systems.

Figure 6:
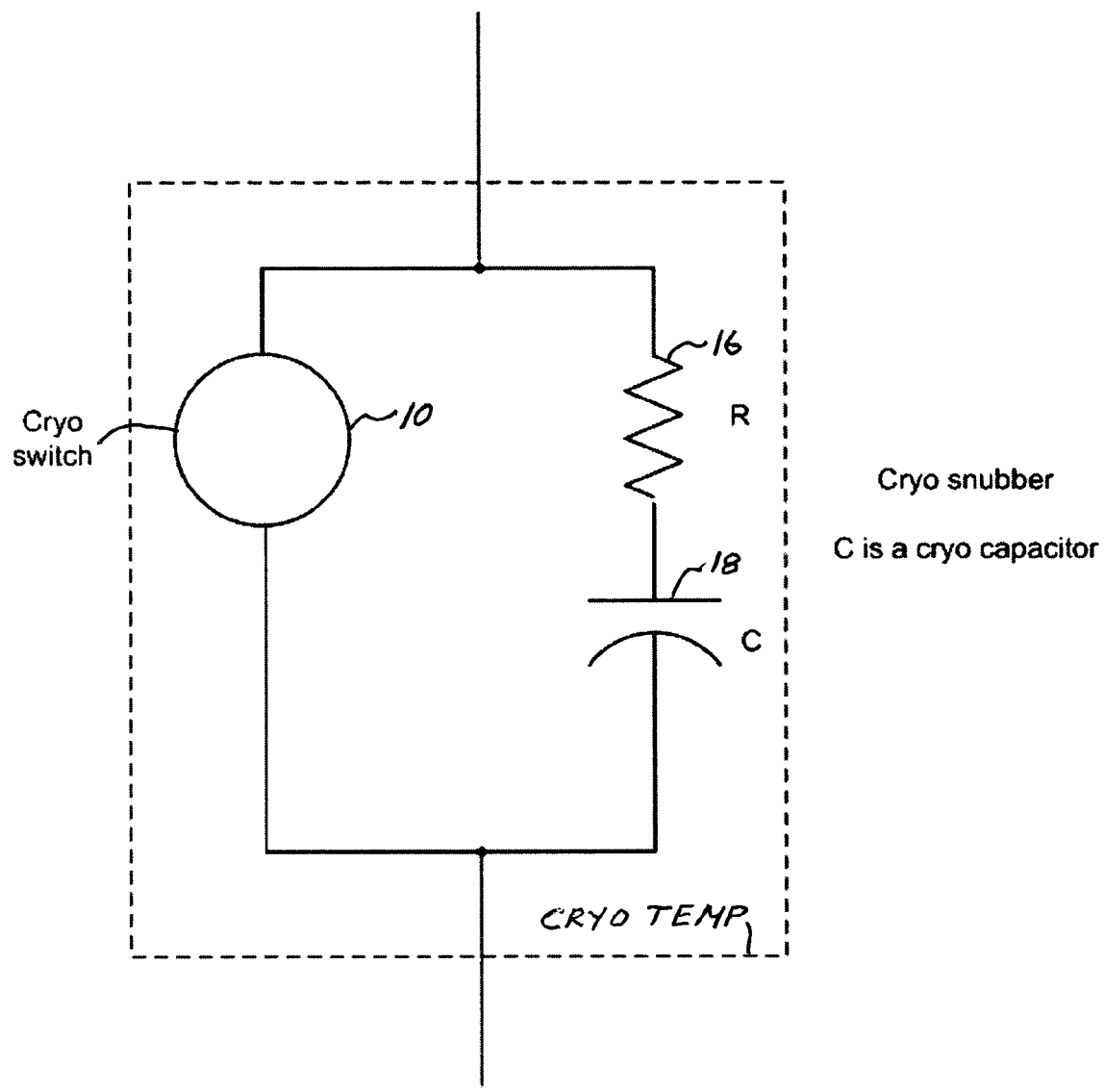

Finally, there may be cases where adding system losses by introducing a cryogenic snubber network is justified or offset by other factors such as size, weight, reliability or performance advantages. Whereas the application of snubbers is known (i.e., snubber networks are widely used in power circuits), the added advantage of having a cryo-capacitor as part of the snubber network, reducing the overall size and weight, is only recently established. A complete cryo-snubber is shown in FIG. 6 where the switch 10 and snubber network 16, 18 are all operated at cryogenic temperature.

What is claimed is:

1. A switching network, comprising:
   a cryogenic solid-state switch for operation at a cryogenic temperature;
   an RC snubber network in parallel with said cryogenic solid-state switch, said RC snubber network including a resistance R in series with a capacitor C; and
   low-loss superconducting leads connecting said RC snubber network in parallel to said solid-state switch, low-loss superconducting leads having a superconducting transition temperature, in operation said capacitor C being operated at a reduced temperature below said superconducting transition temperature and said series resistance R being operated at an elevated temperature above said superconducting transition temperature.

2. A switching network as in claim 1, wherein said C is a cryo-capacitor for operation at cryogenic temperature.

3. A switching network as in claim 2, further comprising a low inductance interconnecting lead between a component of said switching network at cryogenic temperature and another component of said switching network at a temperature higher than said cryogenic temperature.

4. A switching network as in claim 1, wherein said low loss leads are low inductance interconnecting leads between said switch and said RC snubber network.

5. A switching network as in claim 3, wherein said low inductance leads are low-loss cryogenic leads.

6. A switching network as in claim 5, wherein said low loss cryogenic leads are coaxial leads.

7. A switching network as in claim 4 wherein said low loss cryogenic leads are coaxial leads.

8. A switching network, comprising:
   a cryogenic solid-state switch for operation at a cryogenic temperature;
   an RC snubber network in parallel with said cryogenic solid-state switch, said RC snubber network including a resistance R in series with a capacitor C;
   leads interconnecting said RC snubber network in parallel to said solid-state switch, wherein said resistance R operates at a temperature higher than said cryogenic temperature while said switch and capacitor operate at said cryogenic temperature.

9. A switching network as in claim 8, wherein said capacitor C is a cryo-capacitor for operation at cryogenic temperature.

10. A switching network as in claim 8, wherein said interconnecting leads between said switch and said RC snubber network are superconducting and low inductance leads.

11. A switching network as in claim 8, wherein said interconnecting leads are coaxial leads.

\* \* \* \* \*